United States Patent [19]

Ueno et al.

[11] Patent Number: 5,327,131
[45] Date of Patent: Jul. 5, 1994

[54] PARALLEL A/D CONVERTER HAVING COMPARATOR THRESHOLD VOLTAGES DEFINED BY MOS TRANSISTOR GEOMETRIES

[75] Inventors: Masayuki Ueno, Ichikawa; Hiroshi Ogasawara, Chiba; Hideo Sako, Tokyo, all of Japan

[73] Assignee: Kawasaki Steel Corporation, Hyogo, Japan

[21] Appl. No.: 971,509

[22] Filed: Nov. 4, 1992

[30] Foreign Application Priority Data

Nov. 7, 1991 [JP] Japan .................. 3-291263

[51] Int. Cl.$^5$ .............................. H03M 1/36
[52] U.S. Cl. ...................... 341/136; 341/159; 307/350
[58] Field of Search .............. 341/136, 155, 159; 307/350

[56] References Cited

U.S. PATENT DOCUMENTS

| | | | |
|---|---|---|---|
| 4,420,743 | 12/1983 | Upadhyayula | 341/136 |
| 4,533,903 | 8/1985 | Yamada et al. | 341/156 |
| 4,691,189 | 9/1987 | Dingwall et al. | 341/136 |
| 4,845,383 | 7/1989 | Iida | 307/355 |
| 4,872,010 | 10/1989 | Larson et al. | 341/134 |
| 4,940,981 | 7/1990 | Naylor et al. | 341/161 |

FOREIGN PATENT DOCUMENTS 1-259628 10/1989 Japan .

OTHER PUBLICATIONS

IEEE 1991 Custom Integrated Circuits Conference, pp. 26.7.1–26.7.4 A CMOS 9 bit 25MHz 100mW ADC for Mixed Analog/Digital LSIs.
"Transistor Technics", 1990. 12, pp. 982–983.

Primary Examiner—Marc S. Hoff
Attorney, Agent, or Firm—Oliff & Berridge

[57] ABSTRACT

A comparator includes a P-channel MOS transistor connected at the source thereof to a power source and at the drain thereof to a comparator output and the drain of an N-channel MOS transistor. The source of the N-channel MOS transistor is connected to the ground. The gates of the P-channel MOS transistor and the N-channel MOS transistor are connected to a comparator input. The logic threshold voltage of the comparator is adjusted in accordance with a circuit parameter regarding the P-channel MOS transistor and the N-channel MOS transistor such as, a gate length, a gate width or a voltage of the power source. A result of comparison by the comparator between an analog input value inputted to the comparator input and the logic threshold voltage of the comparator is outputted to the comparator output. An analog to digital converter is constructed using the comparator. The analog to digital converter is reduced in size and allows high speed analog to digital conversion.

15 Claims, 9 Drawing Sheets

PARALLEL A/D CONVERTER HAVING COMPARATOR THRESHOLD VOLTAGES DEFINED BY MOS TRANSISTOR GEOMETRIES

BACKGROUND OF THE INVENTION

1. Field of the Invention

This invention relates to an analog to digital converter which converts an analog input value into a digital value, and more particularly to an analog to digital converter which can be reduced in size and effect analog to digital conversion at a high speed. The present invention further relates to an analog to digital converter which includes a plurality of comparators, and particularly to an analog to digital converter which can restrict a peak value in variation of power supply current and reduce power source noise involved in variation of the power supply current.

2. Prior Art

Analog to digital converters have been employed for a long time in an industrial field for measuring instruments such as, for example, digital voltmeters and programmable power sources. Further, in recent years, analog to digital converters have been and are employed for various public applications such as compact disk players and special applications such as CODEC for connecting a telephone set to a digital data switching network.

Further, analog to digital converters of 6 to 8 bits which can operate at a high speed of 10 to 20 MHz are used for applications of special reproduction and noise reduction in a video tape recorder for home use. As the development of the digital technology proceeds in recent years such that, for example, DRAMs (dynamic random access memories) of a comparatively large capacity are employed at a comparatively low cost, and analog to digital converters are employed widely for image processing apparatus, digital signal processors and so forth. A further higher speed operation is requested for analog to digital converters for use for the image processing apparatus, the digital signal processors and so forth.

A flash type analog to digital converter is known as an analog to digital converter which can operate at a high speed. The flash type analog to digital converter causes, when it is an n-bit flash type analog to digital converter, a total of $(2^n-1)$ comparators to operate at a time to effect analog to digital conversion. Different reference voltages obtained by division of a reference voltage using a resistor ladder wherein a total of $2^n$ resistance elements having an equal resistance value are connected in series are inputted to the $(2^n-1)$ comparators. Accordingly, each comparator compares an analog signal voltage with a reference voltage inputted thereto. Then, the flash type analog to digital converter outputs an n-bit digital signal encoded in accordance with results of the comparison by the $(2^n-1)$ comparators. With the flash type analog to digital converter, a digital signal corresponding to an inputted analog signal voltage can be obtained at a speed much higher than integrating type analog to digital converters and successive approximation type analog to digital converters.

Further, as an analog to digital converter which can operate at a high speed, an analog to digital converter called two-step flash type analog to digital converter has been proposed in recent years and is disclosed in U.S. Pat. No. 4,533,903. The two-step flash type analog to digital converter first effects, when it is an (m+n) bit analog to digital converter, analog to digital conversion for the upper m bits using a total of $(2^m-1)$ comparators and then effects analog to digital conversion for the lower n bits using a total of $(2^n-1)$ separate comparators. Accordingly, the number of comparators employed in the two step flash type analog to digital converter totals $(2^m+2^n-2)$. This is very small compared to the total number of comparators employed in such popular flash type analog to digital converters as described above.

In recent years, chopper type comparators have been and are employed as comparators for the two-step flash type analog to digital converter described above. In a chopper type comparator, an analog signal voltage is first inputted to a capacitor connected in series to the input of a CMOS (complementary metal oxide semiconductor) inverter, and then the input and the output of the CMOS inverter are short-circuited so that charge Q corresponding to the analog signal voltage is stored into the capacitor. Then, the input and the output of the CMOS inverter are opened, whereafter the capacitor to which the analog signal voltage has been inputted is connected to a reference voltage. In this instance, the CMOS inverter provides an output of a difference value between the analog signal voltage and the reference voltage in accordance with the positive or negative sign.

Another comparator for use with an analog to digital converter is disclosed in Japanese Patent Laid-Open Application No. 1-259628 wherein it includes a differential amplifier and has a correction input terminal. Comparators employing a differential amplifier are widely used in analog to digital converters together with the chopper type comparators described above. The comparator disclosed in Japanese Patent Laid-Open Application No. 1-259628 can provide an analog to digital converter which operates with a high degree of accuracy and at a high speed without being influenced by a variation of offset voltage. For example, the comparator can reduce the problem of the variation in offset voltage caused by a difference between threshold voltages a pair of transistors when MOS (metal oxide semiconductor) transistors are employed for a comparator which employs the differential amplifier.

While the flash type analog to digital converters described above are advantageous in that they can effect analog to digital conversion at a speed much higher than the integrating type analog to digital converters or the successive approximation type analog to digital converters, they have a problem in that the number of comparators involved is very great.

Also the two step flash type analog to digital converter described above has the problem that the number of comparators is still great although the number is reduced compared to the popular flash type analog to digital converters. For example, a two-step flash type analog to digital converter of 8 bits requires a total of 30 $(=2^4+2^4-2)$ comparators. Accordingly, the conventional flash type analog to digital converters including the two-step flash type analog to digital converter are disadvantageous in that the circuit scale is great and the chip size when fabricated in an integrated circuit is large Meanwhile, in the chopper type comparator for use with an analog to digital converter, two voltages are to be compared with each. That is, an analog input value and a reference voltage must be inputted alternately.

Accordingly, the operating time for conversion is long. Further, an operation of the chopper type comparator for analog to digital conversion involves charging a capacitor in accordance with an analog input value or with a reference voltage and initialization by discharging through short circuiting. Accordingly, a problem of production of noise is also involved. The chopper type comparator has a further problem that the power dissipation is comparatively high due to the dynamic operation described just above during analog to digital conversion.

On the other hand, the comparator employing a differential amplifier normally has the operating speed of 20 to 30 MHz or so. Accordingly, the comparator cannot be employed for an analog to digital converter which effects a converting operation at a higher speed.

SUMMARY OF THE INVENTION

The present invention has been made to solve the problems of the prior art analog to digital converters. It is a first object of the present invention to provide an analog to digital converter which can be reduced in size and operate at a high speed to effect analog to digital conversion.

It is a second object of the present invention to provide an analog to digital converter which can restrict a peak value in variation of power dissipation and reduce power source noise caused by a variation of power dissipation.

According to a first aspect of the present invention, the first object of the present invention is achieved by an analog to digital converter for converting an analog input value into a digital value. The converter comprises at least one switching comparator including a switching active element that outputs a comparator output in accordance with a comparator input and a predetermined logic threshold voltage which is set to a value within a range that can be taken by the analog input value by adjusting a circuit parameter regarding the switching active element. The analog input value is introduced to the comparator input. The converter also comprises means for determining the digital value in accordance with the comparator output.

Preferably, the switching comparator has the configuration of a CMOS inverter so that the first object of the present invention may be achieved and further reduction of the power dissipation may be achieved.

Preferably, the logic threshold voltage of the switching comparator is set by adjustment of a power supply source to the switching comparator so that the first object of the present invention may be achieved and the logic threshold voltage can be set readily to various values.

The analog to digital converter may further comprise a threshold voltage varying switch set including a plurality of threshold voltage varying switch elements for varying the logic threshold voltage of the switching comparator. The converter may still further comprise a switching active element set including a plurality of the switching active elements for changing the number of the switching active elements that are connected in parallel to each other by the turning on/off operations of the threshold voltage varying switch elements of the threshold voltage varying switch set to thereby change the logic threshold voltage. The analog to digital converter achieves the first object of the present invention and makes the logic threshold voltage variable.

According to a second aspect of the present invention, the second object of the present invention is achieved by an analog to digital converter for converting an analog input value into a digital value that comprises a plurality of comparators, a comparing operation stopping switch provided in at least one of the comparators, and means for controlling the turning on or off timing of the comparing operation stopping switch to shift the operation timing of at least part of the comparators.

Preferably, the turning on or off operation of the comparing operation stopping switch is performed in accordance with the output of another one or ones of the comparators that determines digital values of upper bits with respect to the comparator for which the comparing operation stopping switch is provided. With the analog to digital converter, the second object of the present invention is achieved. The speed of the converting operation is further enhanced and the power dissipation is further reduced.

Operation of the analog to digital converter of the first aspect of the present invention will be described subsequently.

As described hereinabove, conventional chopper type comparators and comparators employing a differential amplifier that are popularly employed in analog to digital converters have the individual subjects to be improved. The analog to digital converter according to the first aspect of the present invention has been invented by finding a novel comparator to solve the subjects described above.

Particularly, the present invention has been made taking notice of the fact that a circuit element such as a logic gate of an inverter that includes an active element such as a transistor whose output charges discontinuously or substantially discontinuously into an on or off state (such active element will be hereinafter referred to as switching active element) and can operate at a speed much higher than another circuit element such as a differential amplifier including an active element such as a transistor that continuously provide a continuous output when driven (such active element will be hereinafter referred to as analog active element).

For example, a DTL (diode-transistor logic) gate, a TTL (transistor-transistor logic) gate, an ECL (emitter-coupled logic) gate or a CMOS logic gate outputs a predetermined logic output by means of a switching active element such as a transistor in accordance with a logic input thereto and a predetermined logic threshold voltage thereof. The present invention defined in the first aspect has been made based on a novel point of view that a logic gate having such a characteristic as described above is employed for a comparator. The logic gate employing a switching active element can operate at a speed much higher than a comparator which employs a differential amplifier composed of an analog active element.

In particular, according to the first aspect of the present invention, a circuit element such as, for example, a logic gate, which outputs a logic output by means of a switching active element such as a transistor in accordance with a logic input thereto and a predetermined logic threshold voltage thereof as described above, is constructed such that a comparator input is used as the logic input thereto and a comparator output is used as the logic output to make a switching comparator which compares the comparator input and the predetermined logic threshold voltage.

The logic threshold voltage of the switching comparator is set to a desired value by adjustment of a circuit parameter regarding the switching active element. The logic threshold voltage set by the switching comparator is set within the range that can be taken by the analog input value which is inputted to the comparator input and is to be converted into a digital value. The adjustment of the circuit parameter regarding the switching active element of the switching comparator which is performed in order to set the logic threshold voltage of the switching comparator is performed by adjustment of, for example, (1) the gain $\beta$ of the switching active element, (2) the on resistance of the switching active element, (3) the off resistance of the switching active element, (4) the threshold voltage of the switching active element, (5) the voltage to be applied to the switching active element or the like.

For example, the gain, the on resistance or the off resistance of the switching active element can be adjusted, when the switching active element is, for example, a MOS transistor, by way of the gate width W or the gate length L of the MOS transistor. Meanwhile the voltage to be applied to the switching active element can be adjusted by way of the resistance value of a resistance element or else, by way of the voltage of a power source to be applied to the entire switching comparator including the switching active element. The first aspect of the present invention, however, does not particularly limit such adjustment of a circuit parameter for setting the logic threshold voltage as described above.

It is to be noted that the first aspect of the present invention does not particularly limit the switching comparator employed in the analog to digital converter according to the first aspect of the present invention but only defines the switching comparator outputting its comparator output by means of a predetermined switching active element in accordance with the comparator input and the predetermined logic threshold voltage. The logic threshold voltage can also be set, by adjustment of the circuit parameter, to a desired value within the range which can be taken by the analog input value.

For example, the configuration of the switching comparator may be the configuration of a CMOS inverter. Where the configuration of a CMOS inverter is employed, the power dissipation by the switching comparator can be reduced because the power dissipation of the CMOS inverter is very small in a steady condition having no change of the output.

Further, whether the switching comparator is or is not a CMOS inverter, the first aspect of the present invention makes a resistance ladder unnecessary. The resistor ladder is required in a popular analog to digital converter and produces a large number of reference voltages having different voltages from one another by dividing a single reference voltage. In this instance, the power dissipation by the resistance ladder can be eliminated. In contrast, a comparator which employs a differential amplifier normally includes a constant-current source in the differential amplifier thereof and consequently presents steady power dissipation.

While the adjustment of a circuit parameter of the switching active element for setting a logic threshold voltage defined in the first aspect of the present invention is performed by various means as described hereinabove, the present invention is not limited to this. However, when the setting of the logic threshold voltage is performed by adjustment of a power supply source voltage to be applied to the switching comparator, the variation of the logic threshold voltage arising, for example, from a variation in the fabrication process of the switching comparator can be reduced. Further, when the switching comparator is formed into a semiconductor integrated circuit, a plurality of switching comparators having different logic threshold voltages can be formed in the same integrated circuit pattern since the logic threshold voltage is adjusted by way of the voltage of the power supply source. For example, transistors to be produced can be made common in size and profile among the switching comparators. Consequently, the amount of operation in integrated circuit layout pattern designing can be reduced.

The switching comparator according to the first aspect of the present invention may have a variable logic threshold voltage. For example, the logic threshold voltage may be varied by varying the circuit parameter which determines the logic threshold voltage of the switching comparator by means of a threshold voltage varying switch set composed of a plurality of threshold voltage varying switch elements. For example, the number of those of switching active elements of a switching active element set composed of a plurality of switching active elements that are connected in parallel to each other is varied by the turning on or off operations of the threshold voltage varying switch elements of the threshold voltage varying switch set to thereby vary the logic threshold voltage of the switching comparator. With the switching comparator according to the first aspect of the present invention wherein the logic threshold voltage is variable in this manner, comparison of an analog input value to be converted into a digital value with a plurality of logic threshold voltages can be performed by means of the single switching comparator. Accordingly, the number of comparators to be employed in an analog to digital converter can be reduced.

Subsequently, operation of the analog to digital converter according to the second aspect of the present invention will be described.

In recent years, as the BiCMOS (bipolar complementary metal oxide semiconductor) processing technique proceeds, mixed analog/digital LSIs (large scale integrated circuits) have been popularly employed wherein an analog circuit portion and a digital circuit portion are carried on a single semiconductor chip. Particularly, an analog to digital converter is often formed on a chip together with a digital circuit portion since it has the characteristic that the output thereof is connected to a digital circuit. The degree of integration of LSIs has improved remarkably in recent years including such mixed analog/digital LSIs as described above. Now, the problem of increase of the power dissipation per one entire chip involved is considered.

According to the second aspect of the present invention, particularly in order to achieve reduction of the power dissipation by an analog to digital converter and in order to reduce noise which is produced from the analog to digital converter, an analog to digital converter including a plurality of comparators for converting an analog input value into a digital value comprises a comparing operation stopping switch provided in at least one of the comparators. Since the comparing operation stopping switch is provided in this manner, the operation timing of the comparing operation of the comparator in which the comparing operation stopping switch is provided can be shifted from the comparing operation timing of the other comparators.

Accordingly, in an analog to digital converter which includes a plurality of comparators, it is possible to intentionally shift the operation timing of a particular one of the comparators, reduce the number of those comparators which operate at a time and reduce the peak value of the entire analog to digital converter by the power dissipation of the comparators which operate at a time. Further, the peak of noise caused by the comparing operations of the comparators can be reduced by reducing the number of comparators which operate at a time.

It is to be noted that the analog to digital converter to which the second aspect of the present invention is applied only requires a plurality of comparators, but does not particularly limit the types of the comparators. However, the effects of the second aspect of the present invention are further exhibited with a comparator such as, for example, a chopper type comparator or a switching comparator according to the first aspect of the present invention wherein the power supply current is concentrated or the variation of the power supply current is concentrated at the comparing operation.

It is to be noted that the second aspect of the present invention does not particularly limit the turning on or off timing of the comparing operation stopping switch. The comparing operation timing or timings of at least part of the comparators must only be shifted from the comparison operation timings of the other comparators.

However, when the comparing operation of the comparator wherein the comparing operation stopping switch is provided is started, for example, in response to the output of another comparator which determines a digital value of an upper bit than the comparator, the number of those comparators which actually perform a comparing operation until a digital value results from analog to digital conversion of an analog input value can be reduced as in the third preferred embodiment of the present invention which will be hereinafter described. Accordingly, the power dissipation can be reduced until completion of the analog to digital conversion. In other words, since the comparing operation of a certain comparator can be inhibited in response to the output of a comparator which determines a digital value of a higher bit, the power dissipation of the entire analog to digital converter can be reduced by an amount of the power dissipation by those comparators which do not perform a comparing operation.

As described so far, according to the first aspect of the present invention described above, a superior effect can be achieved that an analog to digital converter which can be further reduced in overall size and effect high speed analog to digital conversion. Meanwhile, according to the second aspect of the present invention, a superior effect can be achieved in that it can provide an analog to digital converter which can restrict the peak value of the variation of the power supply current. Power source noise involved in variation of the power supply current can be reduced.

DESCRIPTION OF THE DRAWINGS

The preferred embodiments will be described with reference to the drawings, wherein like elements have been denoted throughout the figures with like reference characters, and wherein.

DESCRIPTION OF THE PREFERRED EMBODIMENTS

In the following, embodiments of the present invention will be described in detail with reference to the drawings.

Figure 1:
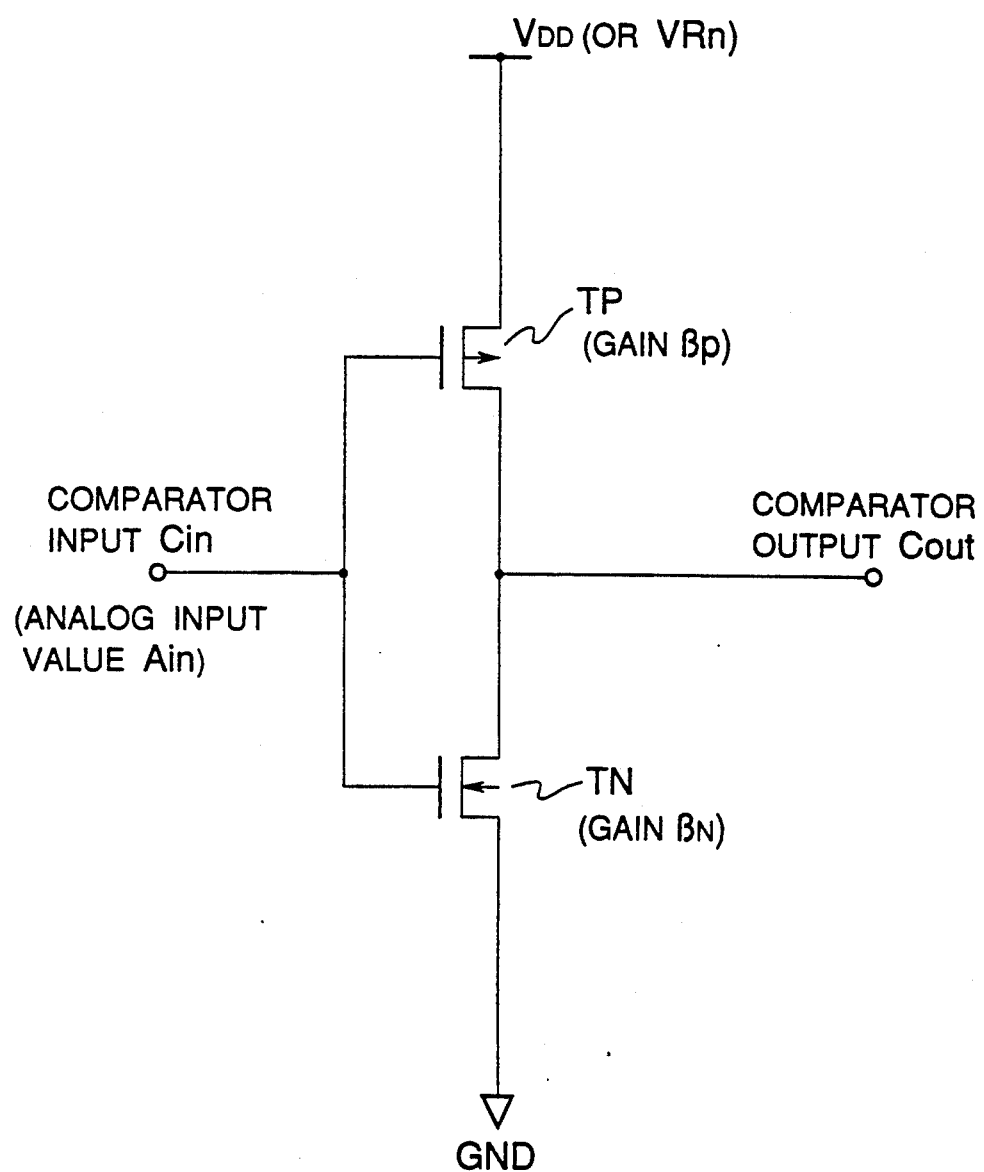
FIG. 1 is a circuit diagram of a switching comparator which is employed in an analog to digital converter of embodiments to which the present invention is applied.

FIG. 1 is a circuit diagram of a switching comparator which is employed in the first and fourth embodiments to which the first aspect of the present invention is applied and in the second and third embodiments to which the first and second aspects of the present invention are applied.

In FIG. 1, the switching comparator to which the first aspect of the present invention is applied is shown. The configuration of the switching comparator is the configuration of a CMOS inverter and is reduced in power dissipation. The power supply current of the CMOS inverter flows principally at the time of the change of the comparator output Cout.

In FIG. 1, the switching comparator is composed of a P-channel MOS transistor TP and an N-channel MOS transistor TN.

The source of the P-channel MOS transistor TP is connected to a power source $V_{DD}$ (or VRn). The drain of the P-channel MOS transistor TP is connected to a comparator output Cout and the drain of the N-channel MOS transistor TN. In particular, the drain of the N-channel MOS transistor TN is connected to the drain of the P-channel MOS transistor TP and also to the comparator output Cout. The source of the N-channel MOS transistor TN is connected to the ground GND. The gate of the P-channel MOS transistor TP and the gate of the N-channel MOS transistor TN are both connected to a comparator input Cin.

When the power source voltage is represented b $V_{DD}$, the threshold voltage of the P-channel MOS transistor TP can be represented by $V_{TP}$. The threshold voltage of the N-channel MOS transistor TN can be represented. The logic threshold voltage $V_{TH}$ of the switching comparator of the CMOS inverter configuration shown in FIG. 1 can be represented in the following equation:

$$V_{TH} = \{V_{DD} + V_{TN} \cdot \beta_R^{\frac{1}{2}} - |V_{TP}|\} / \{1 + \beta_R^{\frac{1}{2}}\} \quad (1)$$

where $\beta_R$ is the ratio between the gain $\beta_N$ of the N-channel MOS transistor TN and the gain $\beta_P$ of the P-channel MOS transistor TP and is given by the following equation:

$$\beta_T = \beta_N / \beta_P \quad (2)$$

The gain $\beta_N$ of the N-channel MOS transistor TN and the gain $\beta_P$ of the P-channel MOS transistor TP can both be calculated in accordance with the following equation for calculating a gain $\beta$:

$$\beta = \mu \cdot C_{OX} \cdot W/L \quad (3)$$

where $\mu$ is a carrier mobility, $C_{OX}$ is the gate capacitance per unit area of the MOS transistor, W is the gate width, and L is the gate length.

As can be seen from the equations (1) to (3) above, the logic threshold voltage of the switching comparator of the CMOS inverter configuration shown in FIG. 1 can be set by the adjustment of any of the following circuit parameters of the circuit shown in FIG. 1:

(1) adjustment of the power source voltage $V_{DD}$ (refer to the equation (1)).

(2) adjustment of the threshold voltage $V_{TN}$ of the N-channel MOS transistor TN or adjustment of the threshold voltage $V_{TP}$ of the P-channel MOS transistor TP (refer to the equation (1)).

(3) adjustment of the gate capacitance $C_{OX}$, the gate width W or the gate width L of the N-channel MOS transistor TN (refer to the equations (1) to (3)).

(4) adjustment of the gate capacitance $C_{OX}$, the gate width W or the gate width L of the P-channel MOS transistor TP (refer to the equations (1) to (3)).

As described so far, with the switching comparator employing the CMOS inverter shown in FIG. 1, the comparator output Cout can be produced in accordance with the comparator input Cin and the predetermined logic threshold voltage $V_{TH}$ by means of the switching logic elements (i.e. the P-channel MOS transistor TP and the N-channel MOS transistor TN). Further, as described hereinabove in connection with the equations (1) to (3), the logic threshold voltage $V_{TH}$ can be set within the range which can be taken by the analog input value Ain inputted from the comparator input Cin.

Such CMOS inverters as shown in FIG. 1 which have the operating speed of up to 1 GHz or so are now available. Accordingly, to the first embodiment of the switching comparator described above, a comparator can also be employed for an analog to digital converter which can effect high speed analog to digital conversion. Further, such a SMOS type inverter as shown in FIG. 1 is particularly low in power dissipation particularly when the signal inputted to the comparator input Cin is in a steady condition. Therefore, the power dissipation of the CMOS type inverter is almost equal to zero.

It is to be noted that the switching comparator according to the present invention is not limited to such a CMOS inverter as described above the reference to FIG. 1, but may be a CMOS logic gate of another circuit configuration or may otherwise be a TTL gate, a DTL gate, an ECL gate or the like. Otherwise, the switching comparator may be such a MOS logic gate (inverter) or an E-D (enhancement-depletion) configuration as shown in FIG. 2.

Figure 2:
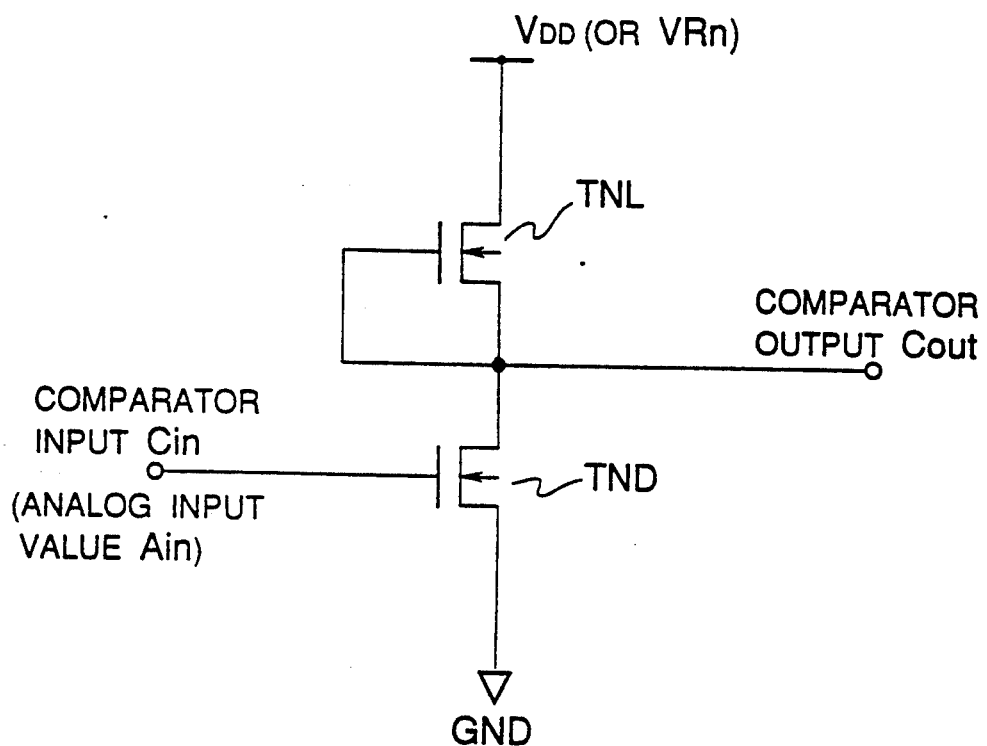
FIG. 2 is a circuit diagram of a modification to the switching comparator.

In the MOS inverter shown in FIG. 2, an N-channel MOS transistor TND is used as an enhancement transistor. Another N-channel MOS transistor TNL is used as a load device in the form of a depletion transistor with the gate and the source thereof short-circuited. When the threshold voltage of the N-channel MOS transistor TND is represented by $V_{TND}$ and the threshold voltage of the N-channel MOS transistor TNL is represented by $V_{TNL}$, the logic threshold voltage $V_{TH}$ of the MOS inverter configuration shown in FIG. 2 can be represented by the following equation:

$$V_{TH} = \{V_{TND} \cdot \beta_R^{\frac{1}{2}} - |\} / 1 + \beta_R^{\frac{1}{2}}\} \quad (4)$$

where $\beta_R$ is the ratio between the gain $\beta_{ND}$ of the N-channel MOS transistor TND and the gain $\beta_{NL}$ of the N-channel MOS transistor TNL and is given by the following equation:

$$\beta_R \beta_{ND} / \beta_{NL} \quad (5)$$

It is to be noted that the gain $\beta_{ND}$ of the N-channel MOS transistor TND and the gain $\beta_{NL}$ of the N-channel MOS transistor TNL appearing in the equation (5) above can both be calculated in accordance with the equation (3) given hereinabove for calculating a gain $\beta$.

Figure 3:
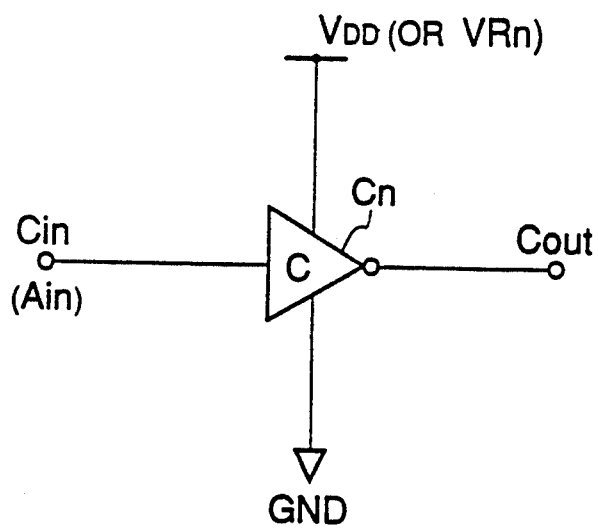
FIG. 3 is a first symbolic diagram showing the switching comparator.
Figure 4:
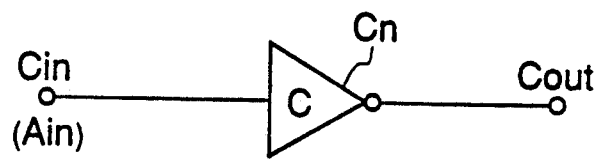
FIG. 4 is a second symbolic diagram showing the switching comparator.

FIGS. 3 and 4 are diagrams showing the entire switching comparators shown in FIGS. 1 and 2, respectively, and indicating symbols used in FIGS. 7 to 10 and 12 which will be hereinafter described.

Particularly, in FIG. 3, the switching comparator shown is generally denoted by reference character $C_n$. The comparator input Cin, the comparator output Cout, the power source $V_{DD}$ (or VRn) and the ground GND for the switching comparator $C_n$ are also shown. Meanwhile, in FIG. 4, the power source $V_{DD}$ and the ground GND are omitted, and only the comparator input Cin and the comparator output Cout of the comparator $C_n$ are shown.

Figure 5:
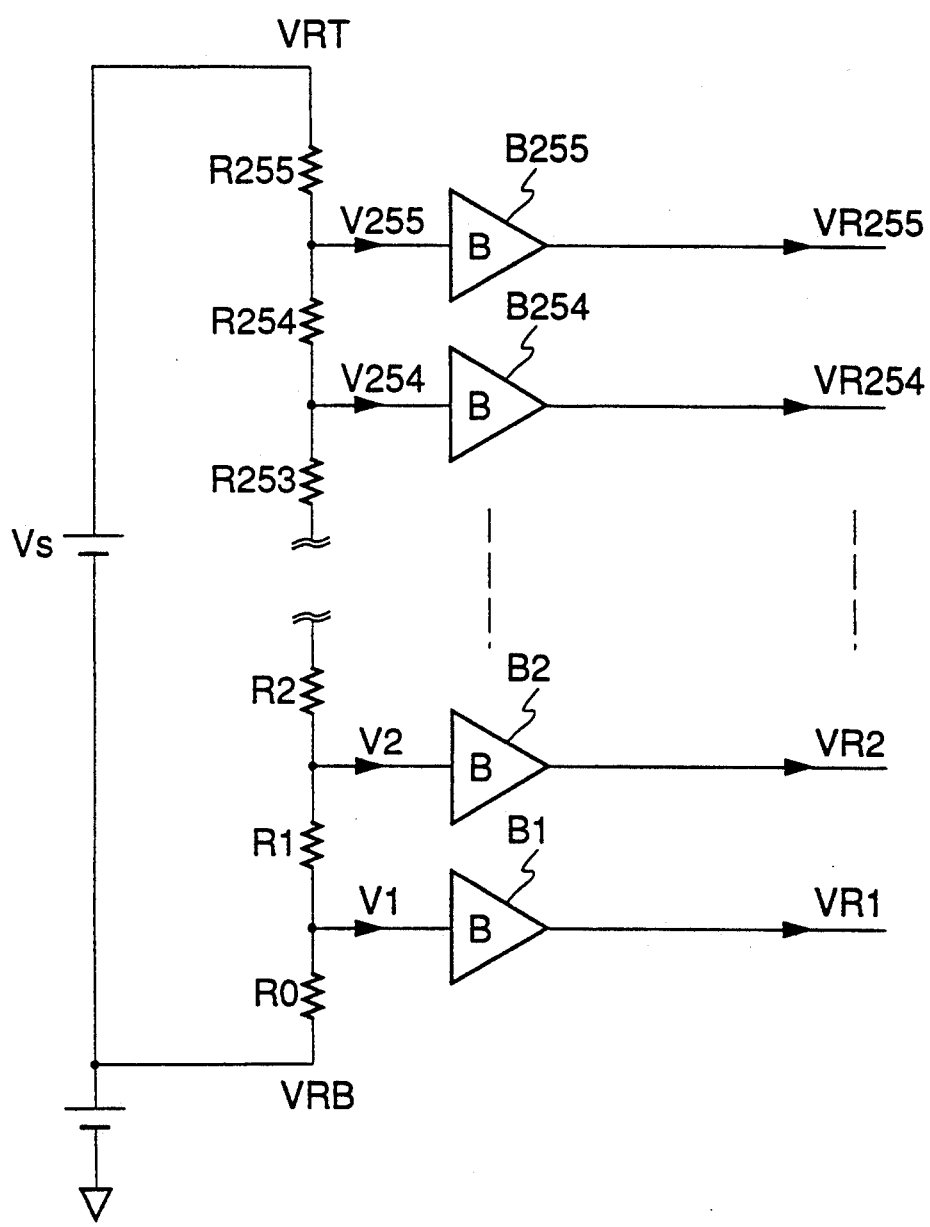
FIG. 5 is a circuit diagram of a power source circuit which is employed in the first embodiment to which the first aspect of the present invention is applied and a second embodiment to which the second aspect of the present invention is applied.

FIG. 5 is a circuit diagram of a power source circuit that generates a plurality of power supply sources having different voltages to be supplied to a plurality of comparators of any of the first to third embodiments mentioned hereinabove.

Referring to FIG. 5, the power source circuit is composed of a total of 256 resistance elements R0 to R255 and a total of 255 power source buffers B1 to B255.

The 256 resistance elements R0 to R255 are connected in series. A predetermined reference voltage Vs is applied between the terminals VRT and VRB of the opposite ends of the series circuit of the 256 resistance elements R0 to R255. The positive side of the reference voltage Vs is connected to the terminal VRT while the negative side of the reference voltage Vs is connected to the other terminal VRB. The 256 resistance elements have an equal resistance value, and a total of 255 reference voltages V1 to V255 are taken from a total of 255 junctions between the 256 resistance elements R0 to R255.

The reference voltages V1 to V255 are input to the 255 power source buffers B1 to B255, respectively. The power source buffers B1 to B255 output power supply sources VR1 to VR255 of voltages corresponding to the reference voltages V1 to V255 input thereto, respectively. The power supply sources VR1 to VR255 are supplied respectively as power sources to a total of 255 switching comparators $C_1$ to $C_{255}$, which are employed in the first to third embodiments mentioned hereinabove and will hereinafter be described. The power source buffers B1 to B255 serve as constant-voltage power sources which output the power supply sources VR1 to VR255 in accordance with the reference voltages V1 to V255 inputted thereto, respectively.

Figure 6:
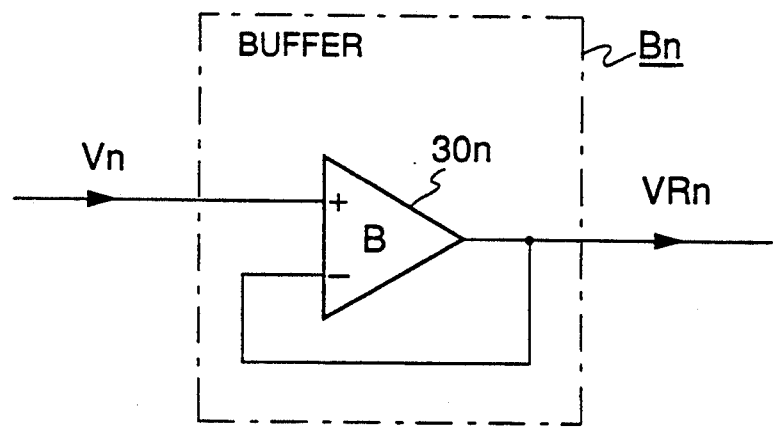
FIG. 6 is a circuit diagram showing a first example of power source buffer which is employed in the power source circuit.

FIG. 6 is a circuit diagram of a first example of a power supply buffer employed in the power source circuit described above.

Referring to FIG. 6, a certain power source buffer Bn of the total of 255 power source buffers B1 to B255 shown in FIG. 5 is shown. The power source buffer Bn includes a buffer 30n in the form of a differential amplifier having a positive input and a negative input. The buffer 30n outputs a power supply source of a voltage in accordance with a difference in voltage between the positive input and the negative input. The buffer 30n receives the reference voltage Vn at the positive input and outputs the power supply source VRn. The voltage of the power supply source VRn which is output from the buffer 30n is negatively fed back to the negative input terminal of the buffer 30n. Accordingly, the power source buffer Bn shown in FIG. 6 supplies the power supply source VRn having a voltage equal to the reference voltage Vn.

Figure 7:
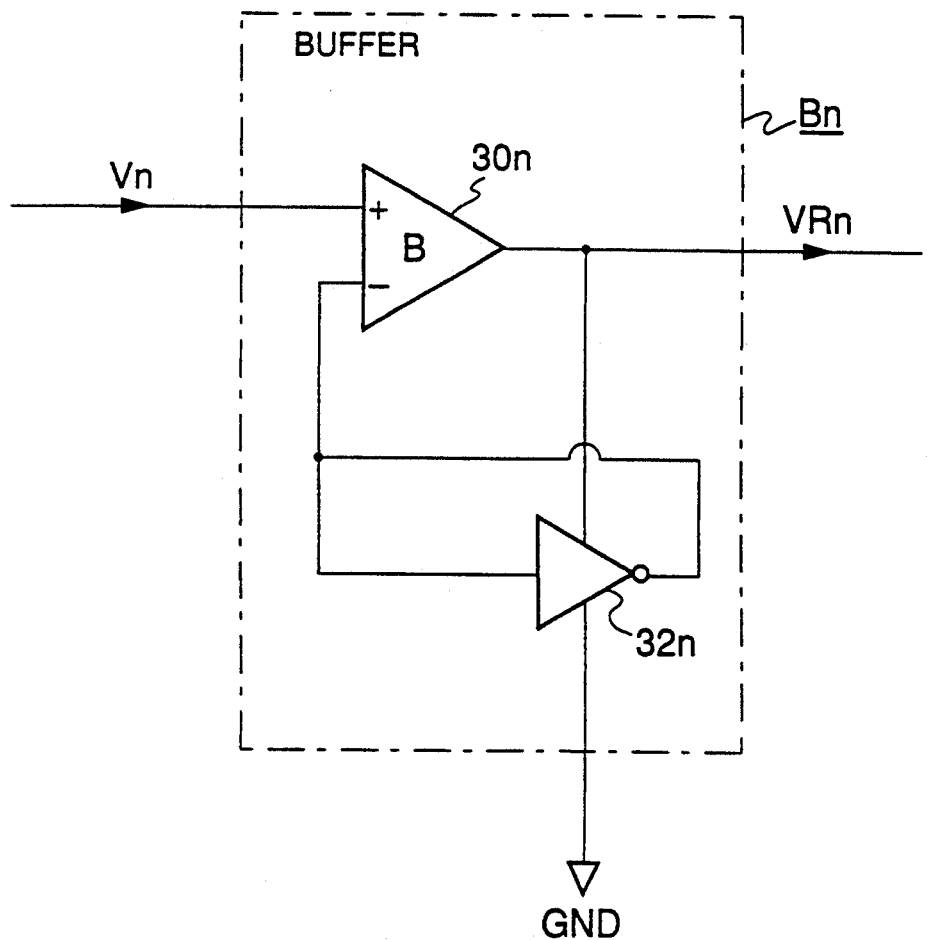
FIG. 7 is a circuit diagram showing a second example of power source buffer which is employed in the power source circuit.

FIG. 7 is a circuit diagram of a second example of a power source buffer employed in the power source circuit described above.

Referring to FIG. 7, the power source buffer Bn is composed of a buffer 30n and an inverter 32n.

The buffer 30n is identical with the buffer 30n described with reference to FIG. 6. The inverter 32n is interposed in the negative feedback loop of the buffer 30n. The input and the output of the inverter 32n are short-circuited and connected to the negative input of the buffer 30n. Meanwhile, the power supply source VRn output from the buffer 30n is supplied to the power source of the inverter 32n. Since the input and the output of the inverter 32n are connected to each other, the output voltage of the inverter 32n is equal to the logic threshold voltage $V_{TH}$ of the inverter 32n. Accordingly, the logic threshold voltage $V_{TH}$ is supplied to the negative input of the buffer 30n when the voltage of the power supply source VRn is supplied to the inverter 32n the negative input of the buffer 30n.

Accordingly, in the power source buffer Bn shown in FIG. 7, the relationship between the reference voltage Vn and the logic threshold voltage $V_{TH}$ of the inverter 32n is given by the following equation:

$$V_n = V_{TH} \quad (6)$$

In the switching comparator shown in FIG. 1 and the switching comparator shown in FIG. 2, the logic threshold voltage $V_{TH}$ is set equal to Vn by supplying the power supply source VRn. Consequently, otherwise possible variations of the logic threshold voltages of inverters caused by a variation of circuit parameters can be prevented.

Figure 8:
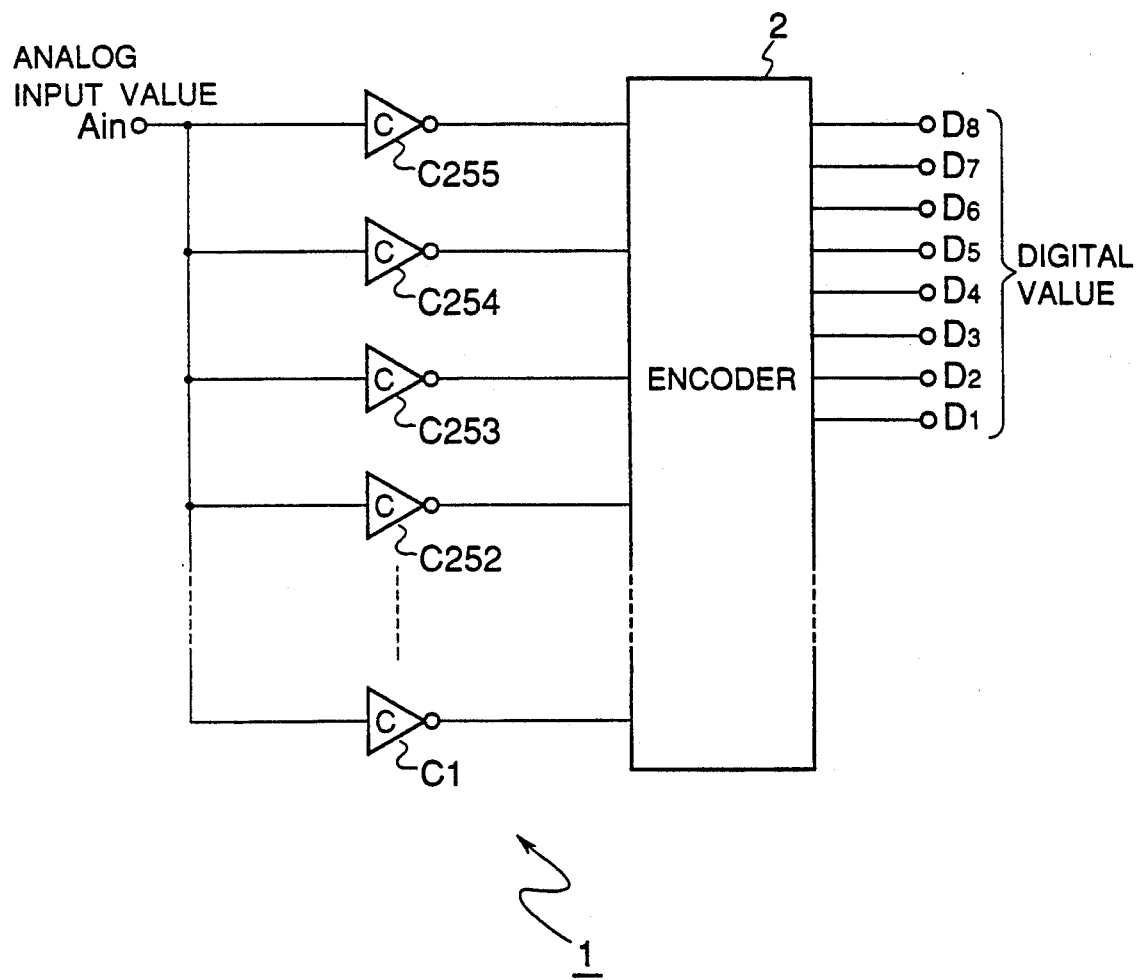
FIG. 8 is a circuit diagram of an entire analog to digital converter of the first embodiment.

FIG. 8 is a circuit diagram of an entire analog to digital converter of the first embodiment to which the present invention is applied.

Referring to FIG. 8, the switching comparator which is described in connection with FIG. 1 and to which the first aspect of the present invention is applied is employed for a total of 255 switching comparators $C_1$ to $C_{255}$ employed in the analog to digital converter 1. The analog to digital converter 1 has a general configuration of a flash type analog to digital converter which converts an analog input value Ain into 8-bit digital values D1 to D8.

The analog to digital converter 1 is composed principally of the total of 255 switching comparators $C_1$ to $C_{255}$ and an encoder 2.

The power supply sources VR1 to VR255 output from the power source circuit described hereinabove with reference to FIG. 5 and having different voltages from one another are supplied as power sources to the 255 switching comparators $C_1$ to $C_{255}$, respectively. The switching comparators $C_1$ to $C_{255}$ have a common circuit configuration, but the power supply sources VR1 to VR255 supplied to the switching comparators $C_1$ to $C_{255}$, respectively, are different from one another. Further, since the power supply sources VR1 to VR255 supplied to the switching comparators $C_1$ to $C_{255}$ are different from one another, the respective threshold voltages $V_{TH1}$ to $V_{TH255}$ of the switching comparators $C_1$ to $C_{255}$ have different values from one another.

The switching comparators $C_1$ to $C_{255}$ are arranged in parallel in order of magnitudes of the respective threshold voltages $V_{TH1}$ to $V_{TH255}$ from the small side. Further, the threshold voltages $V_{TH1}$ to $V_{TH255}$ individually correspond to values obtained by dividing the range (hereinafter referred to as full scale) which the analog input value Ain can take. The range is between a lower limit value Amin and an upper limit value Amax of the analog input value Ain in accordance with a resolution of 8 bits ($2^8 = 256$) of the digital values D1 to D8 output from the analog to digital converter 1. For example, the threshold voltage $V_{THn}$ of the n-th switching comparator Cn is given by the following equation:

$$V_{THn} = Amin + n \times (Amax - Amin)/256 \quad (7)$$

where n is an integer between "1" to "255".

It is to be noted, in the present first embodiment, the threshold voltages $V_{TH1}$ to $V_{TH255}$ of the switching comparators $C_1$ to $C_{255}$ are mainly set in accordance with the voltages of the power supply sources VR1 to VR255 supplied to the switching comparators $C_1$ to $C_{255}$, respectively. However, the threshold voltages $V_{TH1}$ to $V_{TH255}$ of the switching comparators $C_1$ to $C_{255}$ may otherwise be set by some other means. For example, each of the threshold voltages $V_{TH1}$ to $V_{TH255}$ may be set in accordance with the gate width W or the gate length L of the P-channel MOS transistor TP or the N-channel MOS transistor TN of the switching comparator shown in FIG. 1 (refer to the equations (1) to (3) described hereinabove).

The analog input value Ain, which is held by an input buffer, a sample and hold circuit or a like circuit not shown, is input to the comparator inputs Cin of all of the switching comparators $C_1$ to $C_{255}$ for which the threshold voltages $V_{TH1}$ to $V_{TH255}$ are set, respectively, in this manner. The comparator outputs Cout of the switching comparators $C_1$ to $C_{255}$ are inputted independently of one another to the encoder 2.

The comparator output Cout of each of the switching comparators $C_1$ to $C_{255}$ outputs the logic value "1" when the analog input value Ain inputted to the comparator input Cin is lower than the threshold voltage $V_{TH1}$ to $V_{TH255}$. On the other hand, the comparator output Cout of each of the switching comparators $C_1$ to $C_{255}$ outputs the logic value "0" when the analog input value Ain input to the comparator input Cin is higher than the threshold voltage $V_{TH1}$ to $V_{TH255}$.

The encoder 2 binary codes the outputs of the switching comparators $C_1$ to $C_{255}$ input independently of one another into a binary number of 8 bits and outputs corresponding digital values D1 to D8.

For example, when the analog input value Ain is equal to the lower limit value Amin, all of the comparator outputs Cout of the switching comparators $C_1$ to $C_{255}$ present "1", and the encoder 2 converts the value into a binary code. Consequently, all of the digital values D1 to D8 are "0". On the other hand, when the analog input value Ain is equal to the upper limit value Amax, all of the comparator outputs Cout of the switching comparators $C_1$ to $C_{255}$ present "0", and the encoder 2 converts the value into a binary code. Consequently, all of the digital values D1 to D8 of the binary code are "1". Further, when the analog input value Ain is within the range between the lower limit value Amin and the upper limit value Amax both exclusive, as the analog input value Ain increases successively, the comparator outputs Cout of the switching comparators $C_1$ to $C_{255}$ are successively changed "0" from the switching comparator $C_1$ side to the switching comparator $C_{255}$ side while the remaining comparator outputs Cout present "1".

For example, when the analog input value Ain has a certain value, the total 23 switching comparators $C_1$ to $C_{23}$ output the logic value "0" while the other switching comparators $C_{24}$ to $C_{255}$ output the logic value "1" in accordance with the value of the analog input value Ain. In this instance, the encoder 2 encodes the outputs of the logic values of the switching comparators $C_1$ to $C_{255}$ and outputs digital bit values D1 to D8 given by the following equation:

$$D8 = D7 = D6 = D4 = 0 \tag{8a}$$

$$D5 = D3 = D2 = D1 = 1 \tag{8b}$$

In particular, the digital bit values D1 to D8 specified by the equations (8a) and (8b) are "00010111" in binary notation and "23" in decimal notation.

As described so far, according to the first embodiment, the threshold voltages $V_{TH1}$ to $V_{TH255}$ of the total of 255 switching comparators $C_1$ to $C_{255}$ to which the first aspect of the present invention is applied can be set to such mutually different values as given by the equation (7) above. Additionally, a flash type analog to digital converter can be constructed using the switching comparators $C_1$ to $C_{255}$. The switching comparators can perform a comparing operation at a higher speed than such comparators employing differential amplifiers or chopper type comparators as described hereinabove. According to the present first embodiment, the converting speed of a flash type analog to digital converter which can originally perform high speed analog to digital conversion can be further raised.

Further, the switching comparators $C_1$ to $C_{255}$ can be reduced in overall size compared with comparators employing differential amplifiers or chopper type comparators. According to the first embodiment described above, it is possible to reduce the occupied area of the entire analog to digital converter 1 and hence to raise the degree of integration.

It is to be noted that, according to a rough estimate of the inventors, the occupied area of the analog to digital converter of the present first embodiment can be reduced by one half or so and the speed of the analog to digital conversion can be expected to be enhanced by 5 to 10 times or so compared with an analog to digital converter of the same bit number which employs chopper type comparators.

Figure 9:
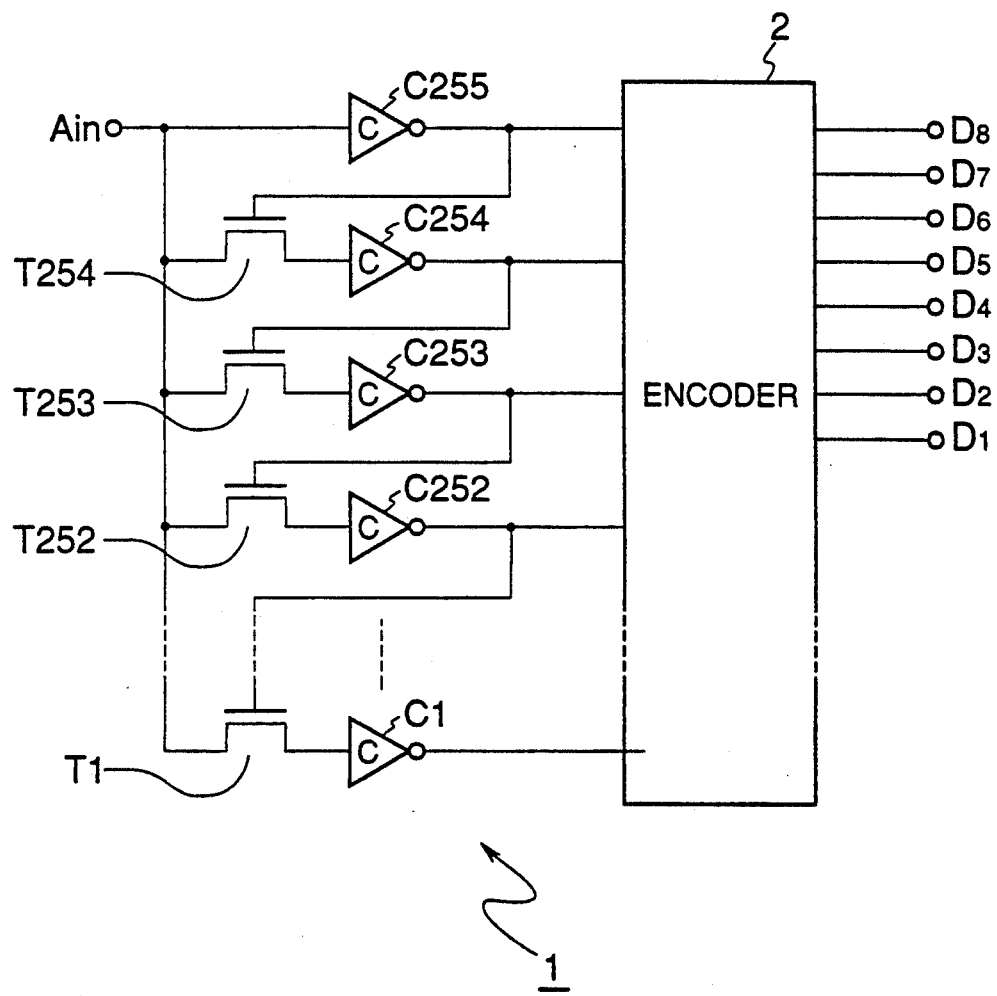
FIG. 9 is a circuit diagram of an entire analog to digital converter of the second embodiment.

FIG. 9 is a circuit diagram of an entire analog to digital converter of the second embodiment to which the first and second aspects of the present invention are applied.

The second embodiment shown in FIG. 9 includes a total of 255 switching comparators each of which is shown in FIG. 1 and to which the first aspect of the present invention is applied. Meanwhile, the second aspect of the present invention is applied as a general configuration to the analog to digital converter 1. Improvements such as reduction in variation of power dissipation and noise reduction to conventional flash type analog to digital converters described above are made in the analog to digital converter 1.

The analog to digital converter 1 of the second embodiment is composed mainly of a total of 255 switching comparators $C_1$ to $C_{255}$, a total of 254 N-channel MOS transistors T1 to T254 corresponding to threshold voltage varying switch elements of the second aspect of the present invention, and an encoder 2. The switching comparators $C_1$ to $C_{255}$ and the encoder 2 employed in the present second embodiment are individually identical with and operate in similar manners as the elements denoted by the like reference characters in FIG. 8 and described hereinabove.

The present second embodiment is characterized, when compared with the first embodiment, in that the N-channel MOS transistors T1 to T254 are connected in series with regard to the sources and the drains between the comparator inputs Cin of the total of 254 switching comparators $C_1$ to $C_{254}$ and the terminal of the analog input value Ain. Further, the gates of the N-channel MOS transistors T1 to T254 are connected to the comparator outputs Cout of the switching comparators $C_2$ to $C_{255}$ which are shown in FIG. 9 directly above the N-channel MOS transistors T1 to T254, respectively. For example, the n-th N-channel MOS transistor Tn is connected to the comparator output Cout of the (n+1)th switching comparator $C_{n+1}$.

Accordingly, in the present second embodiment, the n-th switching comparator $C_n$ is put into a driving condition as the n-th N-channel MOS transistor Tn is turned on only when the output of the (n+1)th switching comparator $C_{n+1}$ presents the logic value "1". That is, when the magnitude of the analog input value Ain is smaller than the threshold voltage $V_{TH(n+1)}$ of the (n+1)th switching comparator $C_{n+1}$. Accordingly, in the present second embodiment, a comparing operation of the n-th switching comparator $C_n$ is performed after completion of a comparing operation at least of the (n+1)th switching comparator $C_{n+1}$. Even when all of the total of 255 switching comparators $C_1$ to $C_{255}$ operate, the operation timings occur in order of magnitudes of the threshold voltages $V_{TH1}$ to $V_{TH255}$. The comparing operations are successively performed at least at intervals of a very short time.

Accordingly, through-currents of the switching comparators $C_1$ to $C_{255}$ of the configuration of the CMOS inverters do not appear in a concentrative manner at a time, and the peak current value of the power source current by the through-currents is restricted. Consequently, reduction of the variation of the power source voltage and reduction of power source noise can be achieved. Further, depending upon the magnitude of the analog input value Ain, only comparing operations of a required number of switching comparators $C_1$ to $C_{255}$ are performed, and also reduction of the average power dissipation of the analog to digital converter 1 can be achieved.

It is to be noted that, while the comparing operations of the switching comparators $C_1$ to $C_{255}$ are successively performed as described above, since the individual comparing operations of the switching comparators $C_1$ to $C_{255}$ can be performed at a high speed, the entire processing speed for analog to digital conversion of the analog to digital converter 1 is not made remarkably slow.

In the present second embodiment, when it is determined at the n-th switching comparator $C_n$ that the magnitude of the analog input value Ain is greater than the threshold voltage $V_{THn}$, the comparing operations of the other succeeding switching comparators $C_1$ to $C_{n-1}$ are not performed. Consequently, the comparator outputs Cout of the switching comparators $C_1$ to $C_{n-1}$ become indeterminate. Accordingly, the encoder 2 is constructed taking the matter into consideration. In particular, the encoder 2 discriminates those two successive switching comparators of the (n+1)th switching comparator $C_{n+1}$ that outputs the logic value "1" and the n-th switching comparator $C_n$ that outputs the logic value "0" which are nearest to the switching comparator $C_{255}$ (i.e., most remote from the switching comparator $C_1$), and effects coding into 8-bit digital values D1 to D8 in accordance with the thus discriminated (n+1)th and n-th switching comparators $C_{n+1}$ and $C_n$.

Figure 10:
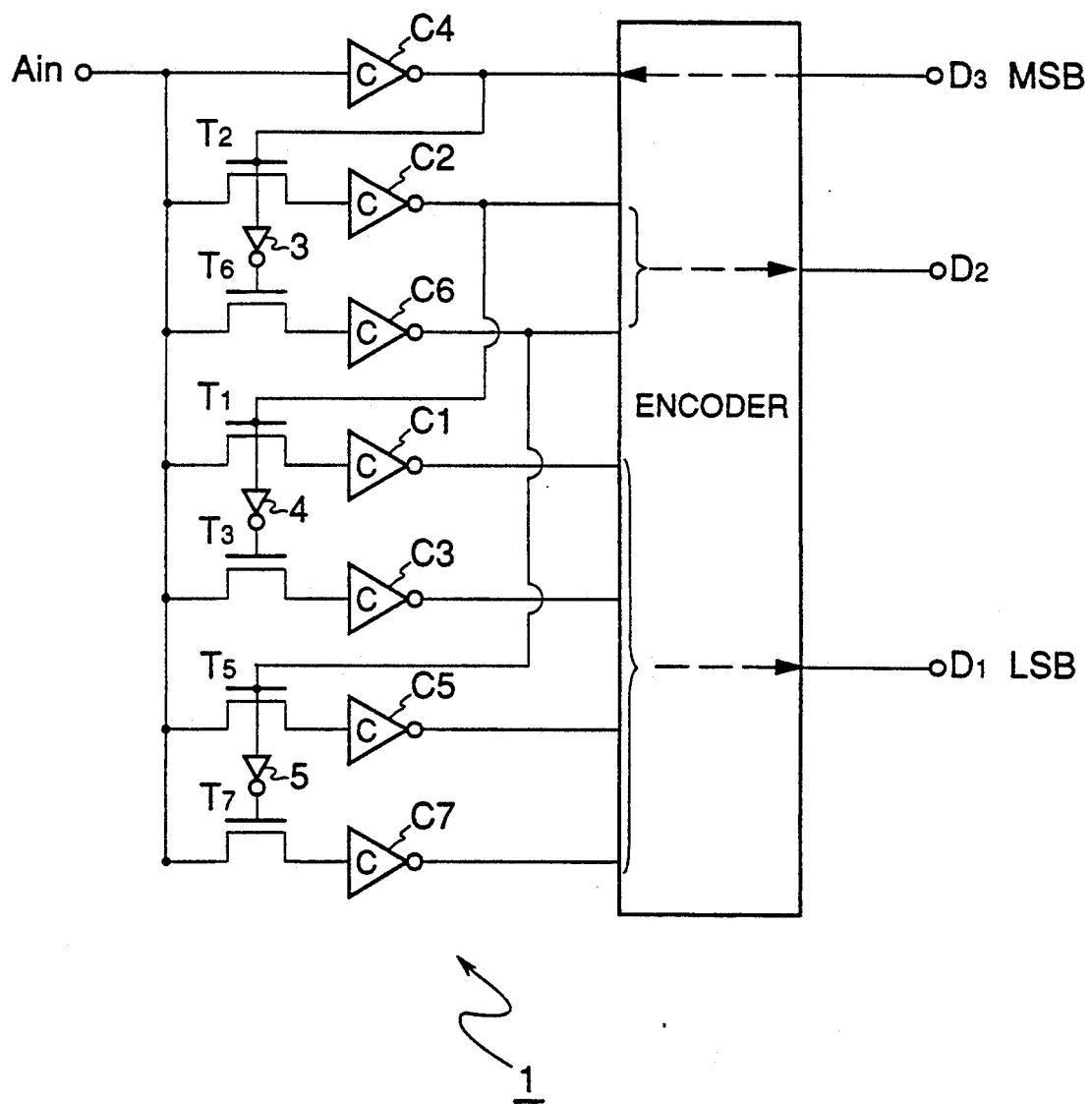
FIG. 10 is a circuit diagram of an entire analog to digital converter of a third embodiment to which the first and second aspects of the present invention are applied.

FIG. 10 is a circuit diagram of an entire analog to digital converter of the third embodiment to which the first and second aspects of the present invention are applied.

The analog to digital converter 1 of the third embodiment shown in FIG. 10 includes a total of 7 switching comparators $C_n$ to which the first aspect of the present invention is applied and which is described hereinabove with reference to FIG. 1. Further, the third embodiment is, as a general configuration, in the form of a 3-bit flash type analog to digital converter to which the second aspect of the present invention is applied. The analog to digital converter converts an analog input Ain into 3-bit digital values D1 to D3.

The analog to digital converter 1 of the third embodiment is composed principally of the total of 7 switching comparators $C_1$ to $C_7$, an encoder 2, a total of 7 N-channel MOS transistors T1 to T7 and a total of 3 inverters 3 to 5.

Figure 11:
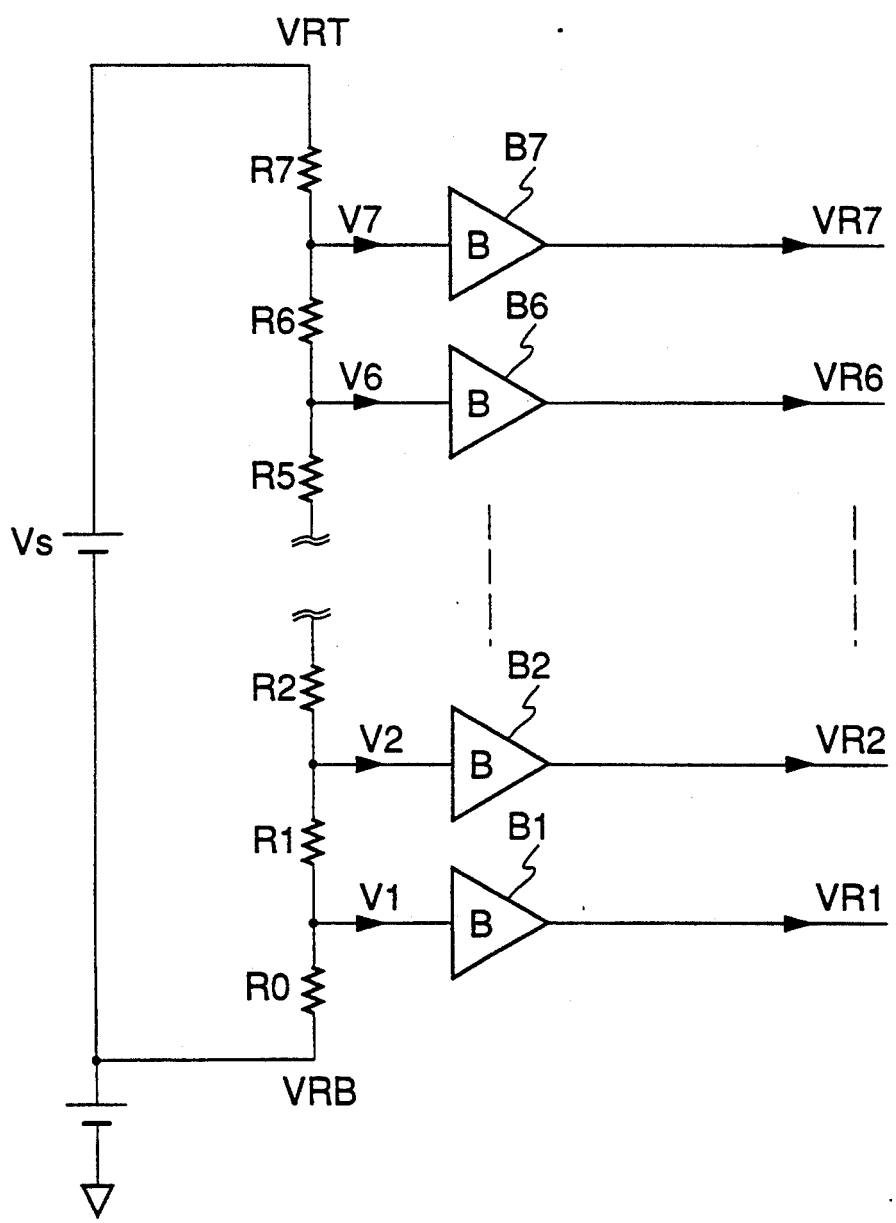
FIG. 11 is a circuit diagram of a power source circuit which is employed in the third embodiment.

Supply power sources VR1 to VR7 generated by a power source circuit shown in FIG. 11 are supplied to the switching comparators $C_1$ to $C_7$, respectively. The power source circuit shown in FIG. 11 and employed in the third embodiment is composed of a total of 8 resistance elements R0 to R7 having an equal resistance value, and a total of 7 power source buffers B1 to B7. The power source buffers B1 to B7 are individually identical with the power source buffers shown in FIG. 5, and one of the power source buffers shown in FIGS. 6 and 7 is employed for the power source buffers B1 to B7.

Referring to FIG. 10, the total of 7 switching comparators $C_1$ to $C_7$ have an identical internal circuit configuration as shown in FIG. 1. Also, the integrated circuit layout patterns of the switching comparators $C_1$ to $C_7$ are identical with each other. Meanwhile, the power supply sources VR1 to VR7 supplied from the power source circuit described with reference to FIG. 11 and having different voltages from one another are supplied to the switching comparators $C_1$ to $C_7$, respectively. Consequently, the threshold voltages $V_{TH1}$ to $V_{TH7}$ of the 7 switching comparators $C_1$ to $C_7$ have different values from one another. The threshold voltage $V_{THn}$ of the n-th switching comparator $C_n$ can be represented in the following equation:

$$V_{THn} = Amin + n \times (Amax - Amin)/8 \qquad (9)$$

Where n is an integer from "1" to "7".

In FIG. 10, the analog input value Ain is input to the comparator input Cin of the switching comparator $C_4$. Further, the N-channel MOS transistors T1 to T3 and T5 to T7 are connected in series with regard to the sources and the drains between the comparator inputs Cin of the 6 switching comparators $C_1$ to $C_3$ and $C_5$ to $C_7$ and the terminal of the analog input value Ain, respectively.

Connected to the output of the switching comparator $C_4$, the threshold voltage $V_{TH4}$ of which is equal to one half the full scale between the lower limit value Amin and the upper limit value Amax, are the gate of the N-channel MOS transistor T2 and the input of the inverter 3. The gate of the N-channel MOS transistor T6 is connected to the output of the inverter 3. Accordingly, when the magnitude of the analog input value Ain is lower than the threshold voltage $V_{TH4}$, the switching comparator $C_2$ performs a comparing operation. On the other hand, when the magnitude of the analog input value Ain is equal to or greater than the threshold voltage $V_{TH4}$, the switching comparator $C_6$ performs a comparing operation.

Further, the output of the switching comparator $C_2$ is connected to the gate of the N-channel MOS transistor T1 and the input of the inverter 4. The output of the inverter 4 is connected to the gate of the N-channel MOS transistor T3. Accordingly, when the magnitude of the analog input value Ain is lower than the threshold voltage $V_{TH2}$, the switching comparator $C_1$ performs a comparing operation. Meanwhile, when the analog input value Ain is greater than the threshold voltage $V_{TH2}$, the switching comparator $C_3$ performs a comparing operation.

In the meantime, the output of the switching comparator $C_6$ is connected to the gate of the N-channel MOS transistor T5 and the input of the inverter 5. The output of the inverter 5 is connected to the gate of the N-channel MOS transistor T7. Accordingly, when the magnitude of the analog input value Ain is lower than the threshold voltage $V_{TH6}$, the switching comparator $C_5$ performs a comparing operation. Meanwhile, when the analog input value Ain is greater than the threshold voltage $V_{TH6}$, the switching comparator $C_7$ performs a comparing operation.

The encoder 2 outputs an inverted value of the output of the switching comparator $C_4$ as a digital value D3 of the MSB (most significant bit). In particular, when the logic value of the output of the switching comparator $C_4$ is "1", the logic value of the digital value D3 is "0" where the logic value of the output of the switching comparator $C_4$ is "0", the logic value of the digital value D3 is "1".

Further, the encoder 2 outputs an inverted value of the output of the switching comparator $C_2$ as a logic value of the digital value D2 when the logic value of the output of the switching comparator $C_4$ is "1". On the other hand, when the logic value of the output of the switching comparator $C_4$ is "0", the encoder 2 outputs an inverted value of the output of the switching comparator $C_6$ as a logic value of the digital value D2.

Further, when the logic value of the output of the switching comparator $C_4$ is "1" and the logic value of the output of the switching comparator $C_2$ is also "1", the encoder 2 outputs an inverted value of the output of the switching comparator $C_1$ as the digital value D1 of the LSB (least significant bit). On the other hand, when the logic value of the output of the comparator $C_4$ is "1" and the logic value of the output of the switching comparator $C_2$ is "0", the encoder 2 outputs an inverted value of the output of the switching comparator $C_3$ as a logic value of the digital value D1 of the LSB.

In the meantime, when the logic value of the output of the switching comparator $C_4$ is "0" and the logic value of the output of the switching comparator $C_6$ is "1", the encoder 2 outputs an inverted value of the output of the switching comparator $C_5$ as a logic value of the digital value D1. On the other hand, when the logic value of the output of the switching comparator $C_4$ is "0" and the logic value of the switching comparator C is also "0", the encoder 2 outputs an inverted value of the output of the switching comparator $C_7$ as a logic value of the digital value D1 of the LSB.

In the analog to digital converter of the present third embodiment having such construction as described above, the N-channel MOS transistors T1 to T3 and T5 to T7 which correspond to the comparing operation stopping switches of the second aspect of the present invention are provided for the switching comparators $C_1$ to $C_3$ and $C_5$ to $C_7$, respectively. Further, in the third embodiment, the N-channel MOS transistors T1 to T3 and T5 to T7 which correspond to the comparing operation stopping switches operate in accordance with the switching comparators $C_2$, $C_4$ and $C_6$ which determine the digital values D2 and D3 which are the upper bits than the digital values D1 and D2 determined by the comparators $C_1$ to $C_3$ and $C_5$ to $C_7$, respectively. Consequently, the respective of the total of 7 switching comparators $C_1$ to $C_7$ that perform a comparing operation for a period of time until the magnitudes of the digital values D1 to D3 are finally determined individually after the analog input value Ain has been supplied are only a total of three of them that are determined in accordance with the analog input value Ain.

In particular, immediately after the analog input value Ain is input, only the first switching comparator $C_4$ first performs a comparing operation. At a next second stage, only one of the switching comparators $C_2$ and $C_6$ performs a comparing operation. Then at a third stage, only one of the switching comparators $C_1$, $C_3$, $C_5$ and $C_7$ performs a switching operation. The magnitudes of the digital values D1 to D3 are determined by operations of only three of the switching comparators $C_1$ to $C_7$ from the first to the third stages.

As described so far, according to the third embodiment, since only a total of three of the switching comparators $C_1$ to $C_7$ perform a comparing operation upon analog to digital conversion of the analog input value Ain, reduction of the overall power dissipation can be achieved. Further, the total of three of the switching comparators $C_1$ to $C_7$ that perform comparing operations do not perform their comparing operations at a time, but their operation timings are shifted by a very short time from each other. Accordingly, the peak value of the power supply current in the present third embodiment is restricted. Also the variation of the power supply current is reduced and the power source noise is also reduced accordingly. Further, even if the operation timings of the comparing operations are shifted from each other in this manner, since the comparing operations of the switching comparators $C_1$ to $C_7$ are performed at a comparatively high speed, the overall processing time necessary for analog to digital conversion of the analog to digital converter 1 is not increased excessively.

Figure 12:
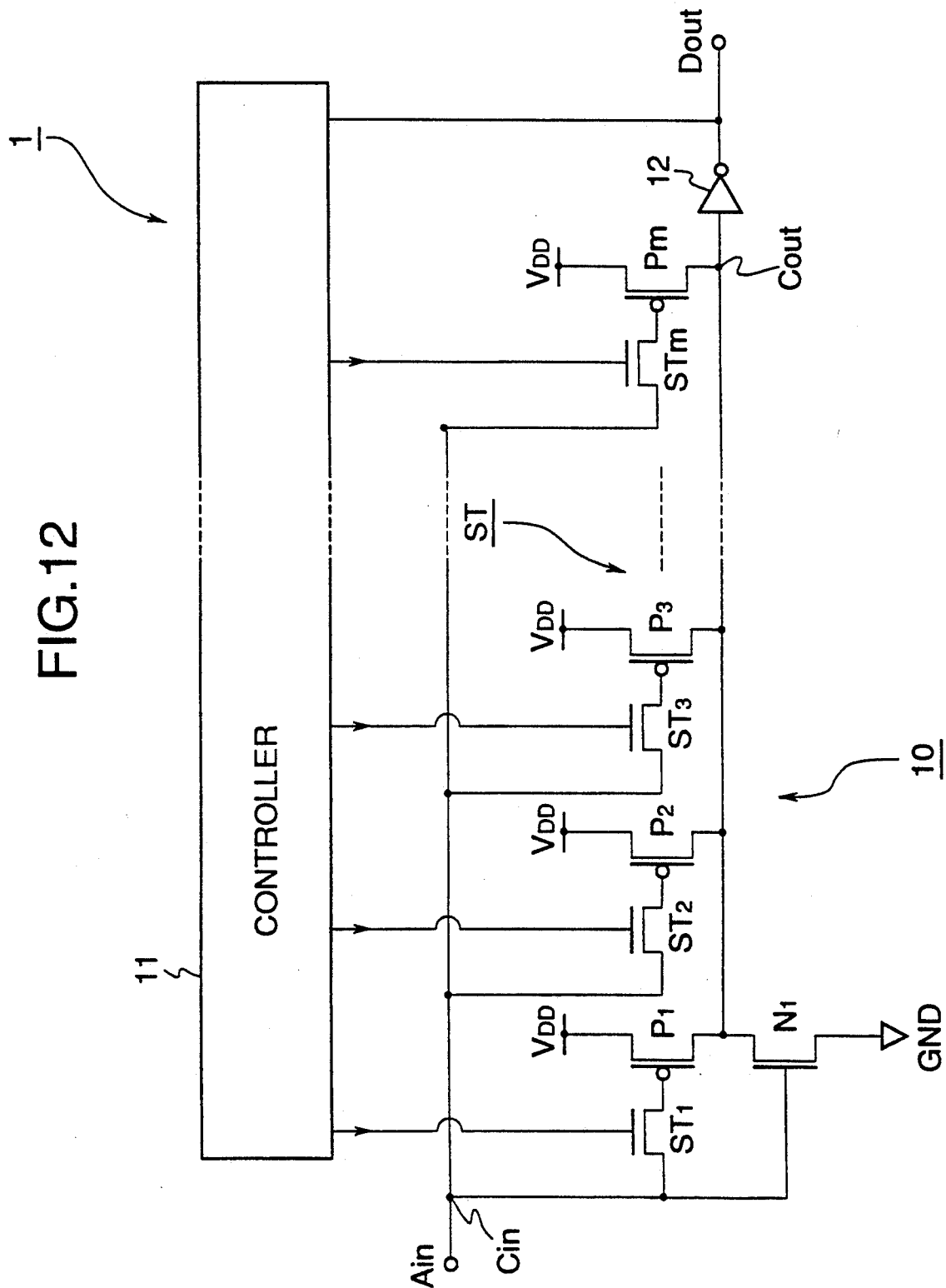
FIG. 12 is a circuit diagram of an entire analog to digital converter of a fourth embodiment to which the first aspect of the present invention is applied.

FIG. 12 is a circuit diagram of an analog to digital converter of the fourth embodiment to which the first aspect of the present invention is applied.

The analog to digital converter I of the fourth embodiment shown in FIG. 12 includes a switching comparator 10 which is composed of a total of m P-channel MOS transistors P1 to Pm and a total of one N-channel MOS transistor N1. The switching comparator 10 has the configuration of a CMOS inverter, and the first aspect of the present invention is applied to the switching comparator 10.

The analog to digital converter 1 includes, in addition to the switching comparator 10, a threshold voltage varying switch set ST composed of a total of m N-channel MOS transistor ST1 to STm, a controller 11 and an inverter 12.

In the switching comparator 10 in the fourth embodiment, all of the m P-channel MOS transistors P1 to Pm are connected at the respective sources to a power source $V_{DD}$ and connected at the respective drains to a comparator output Cout and also to the drain of the N-channel MOS transistor N1. The gates of the P-channel MOS transistors P1 to Pn are connected to the comparator input Cin by way of the sources-drains of the corresponding N-channel MOS transistors ST1 to STm in the threshold voltage varying switch set ST.

When, the N-channel MOS transistor ST1 is turned on, for example the gate of the P-channel MOS transistor P1 is put into a conducting condition to the comparator input Cin. On the other hand, when, the N-channel MOS transistor ST2 is turned on, for example, the gate of the P-channel MOS transistor P2 is put into a conducting condition to the comparator input Cin.

Meanwhile, in the switching comparator 10, the drain of the N-channel MOS transistor N1 is connected to all of the drains of the P-channel MOS transistors P1 to Pm and also to the comparator output Cout. Further, the source of the N-channel MOS transistor N1 is connected to the ground GND, and the gate of the N-channel MOS transistor N1 is connected to the comparator input Cin.

In the switching comparator 10 of the present fourth embodiment having such configuration as described above, the gates of the m P-channel MOS transistors P1 to Pm can be selectively put into a conducting condition to the comparator input Cin by selectively turning on and off the individual N-channel MOS transistors ST1 to STm of the threshold voltage varying switch set ST. The number of the gates of the P-channel MOS transistors Pl to Pm which are to be connected to the comparator input Cin can be varied in this manner.

Accordingly, in the switching comparator 10 having such a configuration as described above, the threshold voltage $V_{TH}$ of the switching comparator 10 can be varied by selectively turning on and off the N-channel MOS transistors ST1 to STm of the threshold voltage varying switch set ST. This can be considered that, if a total of n P-channel MOS transistors Pl to Pn connected in parallel with regard to the sources and the drains are assumed to be a single composite P-channel MOS transistor P, then the element parameters of the P-channel MOS transistor P are varied by selectively turning the individual N-channel MOS transistors STI to STn of the threshold voltage varying switch set ST on and off. For example, it can be considered to vary the imaginary gate width W of the P-channel MOS transistor P.

According to the switching comparator 10 having such a configuration as described above, the logic threshold voltage $V_{TH}$ can be set to a desired value by selective turning on and off of the individual N-channel MOS transistors STI to STm in the threshold voltage varying switch set ST. Further, the switching comparator 10 can perform comparison between the logic threshold voltage $V_{TH}$ and the analog input value Ain.

Further, in the analog to digital converter 1 of the present fourth embodiment, the output of the total of one switching comparator 10 is input to the controller 11 by way of the inverter 12 which is provided for waveform shaping. The controller 11 selectively turns on or off the individual N-channel MOS transistors ST1 to STn of the threshold voltage varying switch set ST in response to an input from the inverter 12 and so forth. Meanwhile, the digital values D1 to D3 are output in order from the MSB to the LSB from the digital output Dout. For example, the operation of the controller 11 may be an operation of a conventional successive approximation type analog to digital converter or a conventional servo-balancing type analog to digital converter.

For example, when the operation of the analog to digital converter 1 is set to an operation of a successive approximation type analog to digital converter by means of the controller 11, first as a first stage, the N-channel MOS transistors ST1 to STn of the threshold voltage varying switch set ST are selectively turned on and off so that the switching comparator 10 may perform comparison of the analog input value Ain with the logic threshold voltage $V_{TH}$ which is equal to one half the full scale of the analog input value Ain. The controller 11 can obtain the MSB of the digital values D1 to Dn in accordance with a result of the comparison at the switching comparator 10, (i.e. the digital output Dout).

Subsequently, as a second stage, the controller 11 determines it in accordance with the result of the comparison at the first stage whether the threshold voltage $V_{TH}$ of the switching comparator 10 should be equal to one fourth of the full scale or three fourths of the full scale. The controller 11 then effects setting of the threshold voltage $V_{TH}$ of the switching comparator 10 by on or off setting of the threshold voltage varying switch set ST in accordance with the determination. Further, a result of comparison of the switching comparator 10 based on the threshold voltage $V_{TH}$ set in this manner is output from the digital output Dout as a logic value of the second bit from the MSB of the digital values D1 to Dn.

Similar processing is performed at a third and following stages. The digital values D1 to D3 of the results of analog to digital conversion of the analog input value Ain from the MSB to the LSB can be obtained from a total of three logic values successively output from the digital output value Dout during a series of such processing steps.

As described so far, according to the present fourth embodiment, analog to digital conversion of the analog input value Ain can be performed only by means of the single switching comparator 10, and it is possible to reduce the number of necessary elements and enhance the degree of integration. Further, the switching comparator 10 can operate at a speed faster than conventional comparators. Accordingly, the analog to digital converter 1 of the present fourth embodiment can achieve a faster speed operation than conventional successive approximation type analog to digital converters and conventional servo-balancing type analog to digital converters.

It is to be noted that, in the present fourth embodiment, the P-channel MOS transistor P connected to the power source $V_{DD}$ side of the switching comparator 10 having the configuration of a CMOS inverter is operated by the threshold voltage varying switch set ST to vary the logic threshold voltage $V_{TH}$. However, alternatively the N-channel MOS transistor Nl may be composed compositely using a large number of N-channel MOS transistors, which are changed over by a suitable means similar to the threshold voltage varying switch set ST to vary the logic threshold voltage $V_{TH}$. Or else, each of the P-channel MOS transistor and the N-channel MOS transistor of the switching comparator 10 of the configuration of a CMOS inverter may be formed as a composite transistor.

In the first to third embodiments described above, when the outputs of the switching comparators $C_1$ to $C_{255}$ are input to the encoder 2, one or a plurality of waveform shaping inverters may be interposed in each of the routes so that a coding operation of the encoder 2 may be performed with a higher degree of stability.

Further, in the second and third embodiments described above, the switching comparator to which the first aspect of the present invention is applied is employed. In the second and third embodiments, however, some other comparator such as, for example, a chopper type comparator or a comparator which employs a differential amplifier may be employed instead.

Furthermore, while in the first to fourth embodiments described above, the switching comparator having the configuration of a CMOS inverter described hereinabove with reference to FIG. 1 is. Another switching comparator having some other configuration may be employed instead such as, for example, a switching comparator having the configuration of an E-D type MOS inverter as shown in FIG. 2.

What is claimed is:
1. An analog to digital converter for converting an analog input value into a digital output value, the converter comprising:
  at least one switching comparator including a switching active element, a comparator output of the at least one switching comparator based on a comparator input of the at least one switching comparator and a predetermined logic threshold voltage, the predetermined logic threshold voltage set to a value within a range of the analog input value by adjusting a circuit parameter of said switching active element, the analog input value input to the at least one switching comparator; and determining means for determining the digital output value based on the comparator output of the at least one switching comparator, wherein the predetermined logic threshold voltage of said at least one switching comparator is set based on a combination of a gain, an on or off resistance, a threshold voltage and a supplied voltage of said switching active element.

2. An analog to digital converter for converting an analog input value into a digital output value, the converter comprising:

at least one switching comparator including a switching active element, a comparator output of the at least one switching comparator based on a comparator input of the at least one switching comparator and a predetermined logic threshold voltage, the predetermined logic threshold voltage set to a value within a range of the analog input value by adjusting a circuit parameter of said switching active element, the analog input value input to the at least one switching comparator; and determining means for determining the digital output value based on the comparator output of the at least one switching comparator, wherein the predetermined logic threshold voltage of said at least one switching comparator is set by an adjustable power supply source, the adjustable power supply source connected to said at least one switching comparator.

3. The analog to digital converter of claim 2, further comprising a power source including a power source buffer supplying power to one of said at least one switching comparator and each comparator of the at least one switching comparators, the supplied power corresponding to a reference voltage.

4. The analog to digital converter of claim 3, wherein said power source buffer is a differential amplifier, the power source buffer including an output buffer and an inverter, the output buffer outputting a voltage based on a voltage difference between a positive input of the output buffer and a negative input of the output buffer, the inverter positioned in a negative feedback loop of the output buffer, the inverter having an input and an output short-circuited and connected to the negative input of said output buffer, an output of said output buffer supplied to a power source of said inverter.

5. The analog to digital converter of claim 2, wherein said at least one switching comparator includes a plurality of switching comparators disposed in a juxtaposed relationship corresponding to a resolution of analog to digital conversion, and further comprising a power source circuit supplying each one of the plurality of switching comparators with a corresponding voltage based on a corresponding logic threshold voltage of each of said plurality of switching comparators, the corresponding voltage supplied to each one the plurality of switching comparators being different from the corresponding voltage supplied to each other one of the plurality of switching comparators, and an encoder converting the output of each one of said switching comparators into a binary code to output a plurality of digital output values, each switching comparator output being input independently into the encoder.

6. The analog to digital converter of claim 5, further comprising a plurality of switching elements, each switching element connected in series between a corresponding comparator input and an analog input terminal, an on state and an off state of each switching element being controlled by a comparator output of an adjacent one of said plurality of switching comparators, said encoder outputting digital values when a logic output value of the plurality of comparators varies.

7. An analog to digital converter for converting an analog input value into a digital output value, the converter comprising:

at least one switching comparator including a switching active element, a comparator output of the at least one switching comparator based on a comparator input of the at least one switching comparator and a predetermined logic threshold voltage, the predetermined logic threshold voltage set to a value within a range of the analog input value by adjusting a circuit parameter of said switching active element, the analog input value input of the at least one switching comparator;

determining means for determining the digital output value based on the comparator output of the at least one switching comparator;

a threshold voltage varying switch set including a plurality of threshold voltage varying switch elements varying the predetermined logic threshold voltage of said at least one switching comparator; and a switching active element set including a plurality of said switching active elements changing the predetermined logic threshold voltage by turning said threshold voltage varying switch elements to one of an on state and an off state, the plurality of switching active elements connected in parallel.

8. The analog to digital converter of claim 7, wherein said switching active element set includes a plurality of P-channel MOS transistors and an N-channel MOS transistor.

9. The analog to digital converter of claim 8, further comprising an inverter shaping a waveform of the comparator output of said at least one switching comparator, and a controller turning said plurality of switching elements to one of the on state and the off state in response to the inverter output.

10. The analog to digital converter of claim 7, wherein said switching active element set includes a plurality of N-channel MOS transistors and a P-channel MOS transistor.

11. The analog to digital converter of claim 7, wherein said switching active element set includes a plurality of P-channel MOS transistors and a plurality of N-channel MOS transistors.

12. An analog to digital converter for converting an analog input value into a plurality of digital output values, the converter comprising:

a plurality of comparators, at least one of the comparators including a comparing operation stopping switch; and controlling means for turning the comparing operation stopping switch to one of an on state and an off state to shift an operation timing of at least one of said plurality of comparators.

13. The analog to digital converter of claim 12, wherein said comparing operation stopping switch is positioned between an analog input terminal and a respective comparator input, the on state and the off state switching operation of the comparing operation stopping switch controlled by an output of an adjacent one of said comparators, said respective comparator performing a comparing operation after the adjacent comparator completes a corresponding comparing operation.

14. The analog to digital converter of claim 12, wherein the on state and the off state switching operation of said comparing operation stopping switch is controlled by the output of at least one other of said plurality of comparators which determine digital output values of at least one upper bit with respect to the respective comparator for which said comparing operation stopping switch is provided.

15. The analog to digital converter of claim 14, wherein said comparing operation stopping switch is positioned between said analog input terminal and said respective comparator input, the on state and the off state switching operation of one set of the switch controlled by the at least one other comparator output which determines the at least one upper bit while the on state and the off state switching operation of the other set of the switch is controlled by the at least one other comparator output which determines the at least one upper bit using an inverter, the comparators of only one of the two sets performing the comparing operations successively in accordance with results of the comparison of the at least one other comparator for the determination of the at least one upper bit.

* * * * *

UNITED STATES PATENT AND TRADEMARK OFFICE
CERTIFICATE OF CORRECTION

PATENT NO. : 5,327,131
DATED : July 5, 1994
INVENTOR(S) : Masayuki Ueno, Hiroshi Ogasawara, Hideo Sako It is certified that error appears in the above-indentified patent and that said Letters Patent is hereby corrected as shown below:

ON THE TITLE PAGE: item,

[75] Inventors: Masayuki Ueno, Ichikawa; Hiroshi Ogasawara, Chiba; Hideo Sako, [Tokyo] Higashihiroshima, all of Japan Signed and Sealed this Eleventh Day of October, 1994

Attest:

BRUCE LEHMAN

Attesting Officer        Commissioner of Patents and Trademarks